United States Patent
Burns et al.

(10) Patent No.: US 7,182,203 B2
(45) Date of Patent: Feb. 27, 2007

(54) WAFER CONTAINER AND DOOR WITH VIBRATION DAMPENING LATCHING MECHANISM

(75) Inventors: John Burns, Colorado Springs, CO (US); Matthew A. Fuller, Colorado Springs, CO (US); Jeffery J. King, Colorado Springs, CO (US); Martin L. Forbes, Divide, CO (US); Mark V. Smith, Colorado Springs, CO (US)

(73) Assignee: Entegris, Inc., Chaska, MN (US)

( * ) Notice: Subject to any disclaimer, the term of this patent is extended or adjusted under 35 U.S.C. 154(b) by 7 days.

(21) Appl. No.: 10/982,402

(22) Filed: Nov. 5, 2004

(65) Prior Publication Data

US 2005/0115867 A1 Jun. 2, 2005

Related U.S. Application Data

(60) Provisional application No. 60/518,442, filed on Nov. 7, 2003.

(51) Int. Cl.
*B65D 85/30* (2006.01)
(52) U.S. Cl. .................... 206/710; 220/326
(58) Field of Classification Search ........ 206/710–712, 206/832, 454, 723; 220/324, 326; 292/32–37, 292/40, 41, DIG. 61; 70/63, DIG. 42
See application file for complete search history.

(56) References Cited

U.S. PATENT DOCUMENTS

| | | | | |
|---|---|---|---|---|
| 3,333,878 A | * | 8/1967 | Pelcin | 292/37 |
| 3,953,061 A | * | 4/1976 | Hansen et al. | 292/5 |
| 4,836,707 A | * | 6/1989 | Myers | 403/322.4 |
| 5,096,238 A | * | 3/1992 | Mintz | 292/35 |
| 5,915,562 A | * | 6/1999 | Nyseth et al. | 206/710 |
| 6,105,782 A | * | 8/2000 | Fujimori et al. | 206/710 |
| 6,457,598 B1 | * | 10/2002 | Hsieh et al. | 220/323 |
| 6,880,718 B2 | * | 4/2005 | Eggum | 220/323 |
| 2005/0133402 A1 | * | 6/2005 | Matsutori et al. | 206/710 |

* cited by examiner

*Primary Examiner*—Mickey Yu
*Assistant Examiner*—Jerrold Johnson
(74) *Attorney, Agent, or Firm*—Patterson, Thuente, Skaar & Christensen, P.A.

(57) ABSTRACT

A container for holding a plurality of wafers in an axially aligned, generally parallel spaced apart arrangement includes an enclosure portion having a top, a bottom, a pair of opposing sides, a back and an open front. At least one wafer support is provided in the enclosure along with a kinematic coupling on the bottom of the enclosure. The container has a door for sealingly closing the open front which includes a chassis and an operable latching mechanism on the chassis. The latching mechanism includes a cam selectively rotatable to shift the latching mechanism between a first favored position and a second favored position and at least one vibration dampener for dampening vibrations generated when the latching mechanism is shifted between the first and second favored positions.

9 Claims, 5 Drawing Sheets

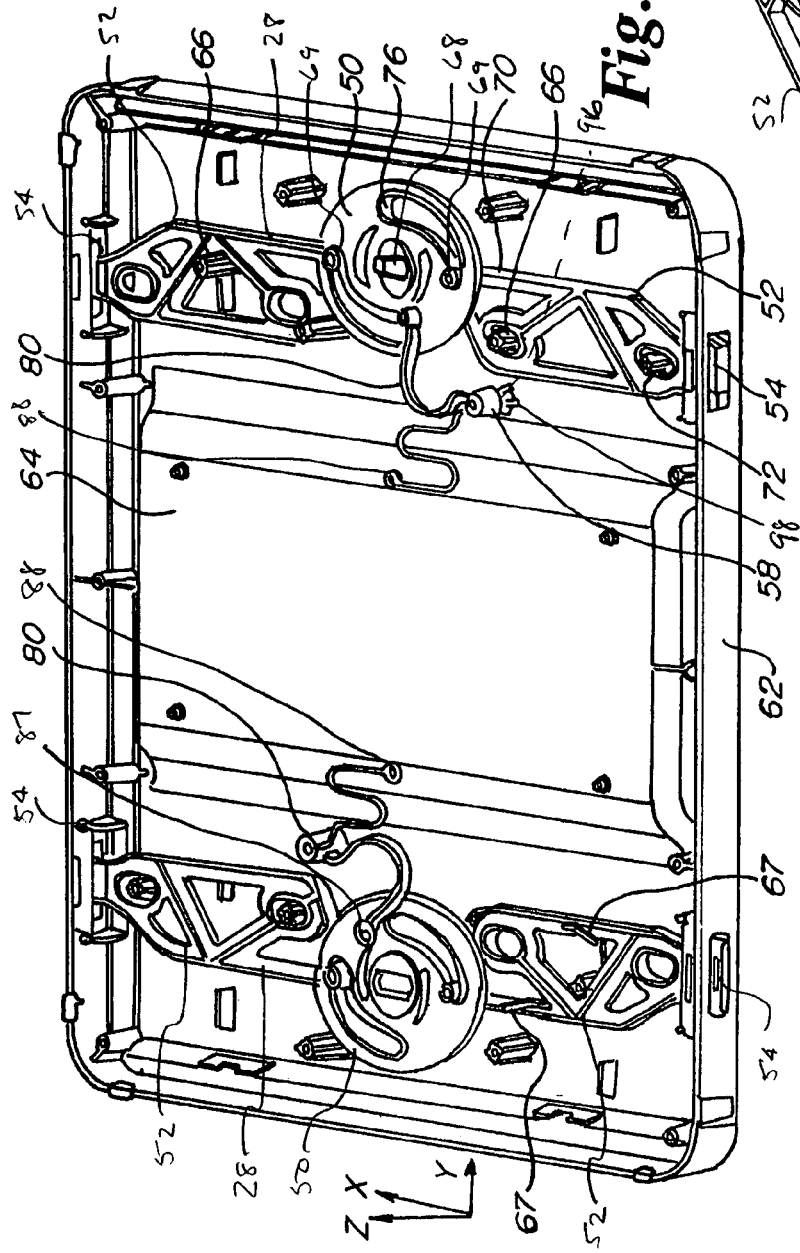
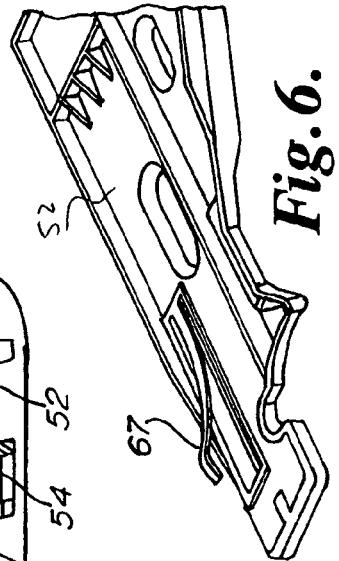
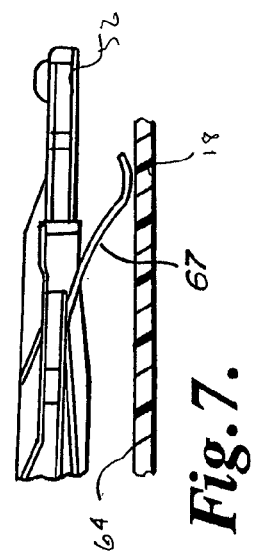

WAFER CONTAINER AND DOOR WITH VIBRATION DAMPENING LATCHING MECHANISM

RELATED APPLICATIONS

This application claims the benefit of U.S. Provisional Patent Application Ser. No. 60/518,442, filed Nov. 7, 2003, hereby fully incorporated herein by reference.

FIELD OF THE INVENTION

This application relates to sealable wafer containers, and more specifically to door latching mechanisms for wafer containers.

BACKGROUND OF THE INVENTION

Semiconductor wafers have become larger in scale, now with fabrication facilities commonly utilizing 300 mm wafers to be manufactured into semiconductor devices such as integrated circuits. The integrated circuits themselves have become larger in size with increasing circuit densities. As a consequence, the size of particulate contaminants that can destroy a circuit have decreased significantly, and strict particulate control is necessary during all phases of manufacturing, processing, transporting, and storage of semiconductor wafers.

Wafers are commonly stored and transported in sealed front-opening wafer containers that have a door secured by latches on the open front. The door can be typically removed manually or robotically. Such wafer containers are known in the industry as FOUPs, which is an acronym for front-opening unified pod, and FOSBs, an acronym for front-opening shipping box. The doors on these types of containers are operated with robotic interfaces that have precisely positioned keys that insert into the front of the door to operate latching mechanisms to remove and place the door with respect to the container portion.

Wafer container latching mechanisms ideally have certain characteristics. First, it is desirable that they operate reliably and consistently to latch and unlatch the door. Additionally, it is desirable that the latching mechanisms are made and designed so as to emit a minimum of particulates, such as may be generated by sliding contact of parts during operation. It is further desirable that the latch mechanisms are simple to manufacture, assemble, and clean. Moreover, it is desirable that these latching mechanisms operate smoothly with controlled changes in the relative velocities of moving parts. Many typical existing wafer container latching mechanisms exhibit relatively abrupt deceleration of components. For example, in some such mechanisms, moving parts collide with a fixed stop at the limits of travel. The result is impact and vibration that serves to "launch" any particulates that may be resting on surfaces in the container, thereby enabling such particulates to later precipitate onto the wafers causing contamination and damage. What is needed in the industry is a wafer container having a latching mechanism with improved velocity and vibration control characteristics.

SUMMARY OF THE INVENTION

The present invention meets the need of the industry for a wafer container with a door latching mechanism having improved velocity control and vibration characteristics. According to an embodiment of the invention, a container for holding a plurality of wafers in an axially aligned, generally parallel spaced apart arrangement includes an enclosure portion having a top, a bottom, a pair of opposing sides, a back and an open front. At least one wafer support is provided in the enclosure along with a kinematic coupling on the bottom of the enclosure. The container has a door for sealingly closing the open front which includes a chassis and an operable latching mechanism on the chassis. The latching mechanism includes a cam selectively rotatable to shift the latching mechanism between a first favored position and a second favored position and at least one vibration dampener for dampening vibrations generated when the latching mechanism is shifted between the first and second favored positions.

In an embodiment of the invention, the latching mechanism includes a biasing spring for biasing the latching mechanism toward the first and second favored positions. The biasing spring includes a secondary portion operably coupled with the chassis for dampening vibrations generated by the latching mechanism during operation. Where desired, the cam and spring may be made from electrically conductive material and the secondary portion of the spring may be coupled with a wafer cushion on the inside surface of the door to provide an electrical path to ground from wafers in the container.

In other embodiments of the invention, the latching mechanism includes at least one latching arm with a cam follower portion engaged in a slot defined in the cam. The slot has a spring disposed proximate either one or both ends of the slot to engage and provide a biasing force opposing movement of the cam follower toward the end of the slot at which the spring is located.

In embodiments of the invention, a wafer container for holding a plurality of wafers has a door that sealably attaches to a container portion to form a sealed substrate container. The door has a latching mechanism with dampening and positioning means that facilitates economical manufacture, reliable operation, smooth and quiet operation, and effective latching for sealing the door. In preferred embodiments, a preferred rotatable cam is formed from a thermoplastic material, and has a slot or other structure for engaging a cam follower. The cam follower engaging structure has internal integral finger-shaped dampening springs. Cam follower portions of the latch arms engage the cam follower engaging structure.

A feature and advantage of the invention are the integral springs, which are molded as part of the components that are attached to provide velocity control, positioning, and dampening characteristics to the mechanism.

An additional feature and advantage of the invention is that the latch arm has an integral finger spring that extends from the latch arm at an acute angle to engage the enclosure as necessary to constrain the lever arm.

Another feature and advantage of the invention is that the integrally molded springs minimize the number of components for assembly and thus minimize component connection joints which can accumulate and trap particulates.

An advantage and feature of the invention is that the latching mechanism operates smoother and more quietly with less particulate launching due to the vibration dampening features.

BRIEF DESCRIPTION OF THE DRAWING

FIG. 2 is a perspective view of a wafer container door with the front cover removed;

FIG. 6 is a perspective view of a portion of a latch arm illustrating an integral spring finger;

FIG. 7 is a side elevational view of a portion of an end of a latch arm illustrating an integral spring finger.

DETAILED DESCRIPTION OF THE PREFERRED EMBODIMENTS

Figure 1:
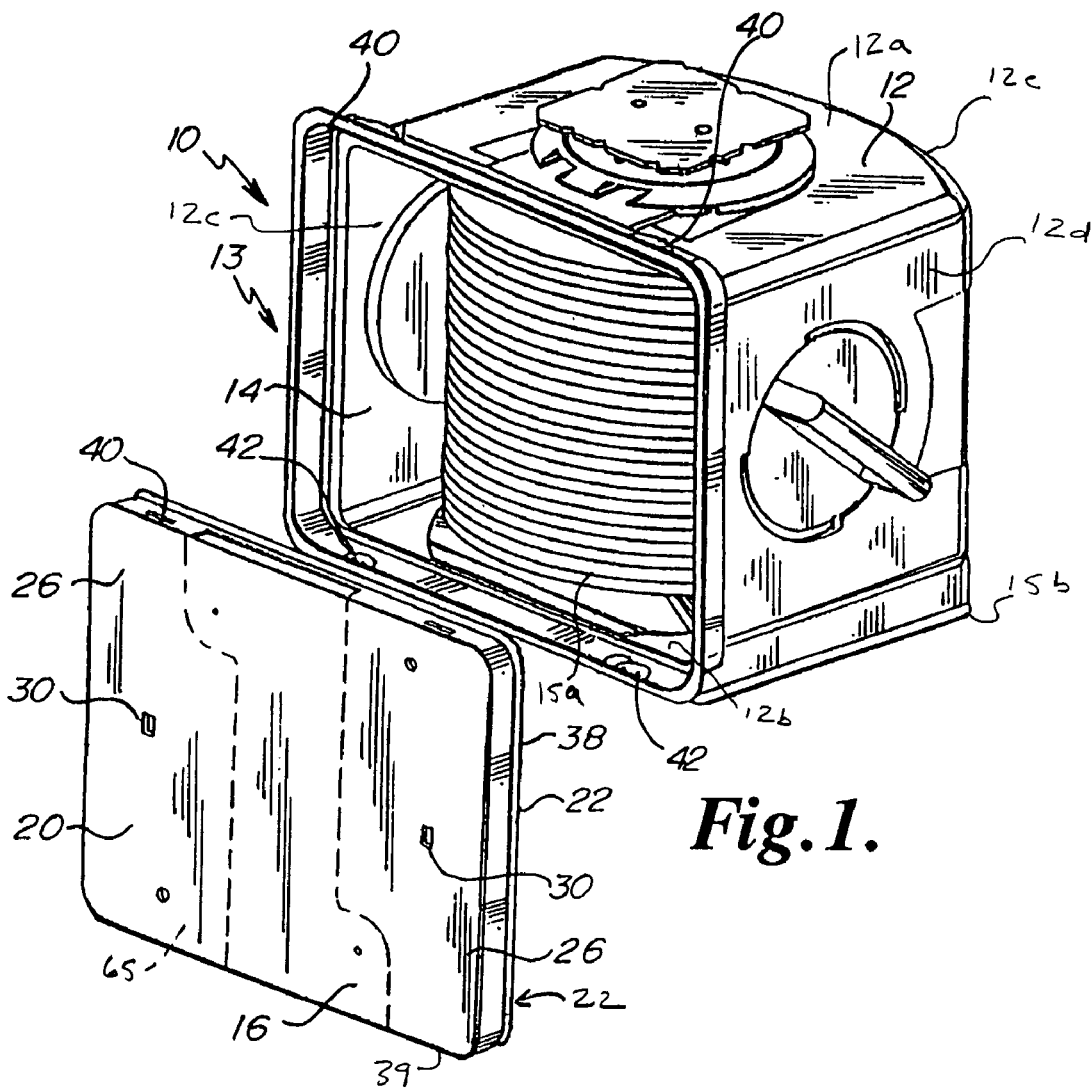
FIG. 1 is a perspective view of a front-opening wafer carrier.
Figure 1A:
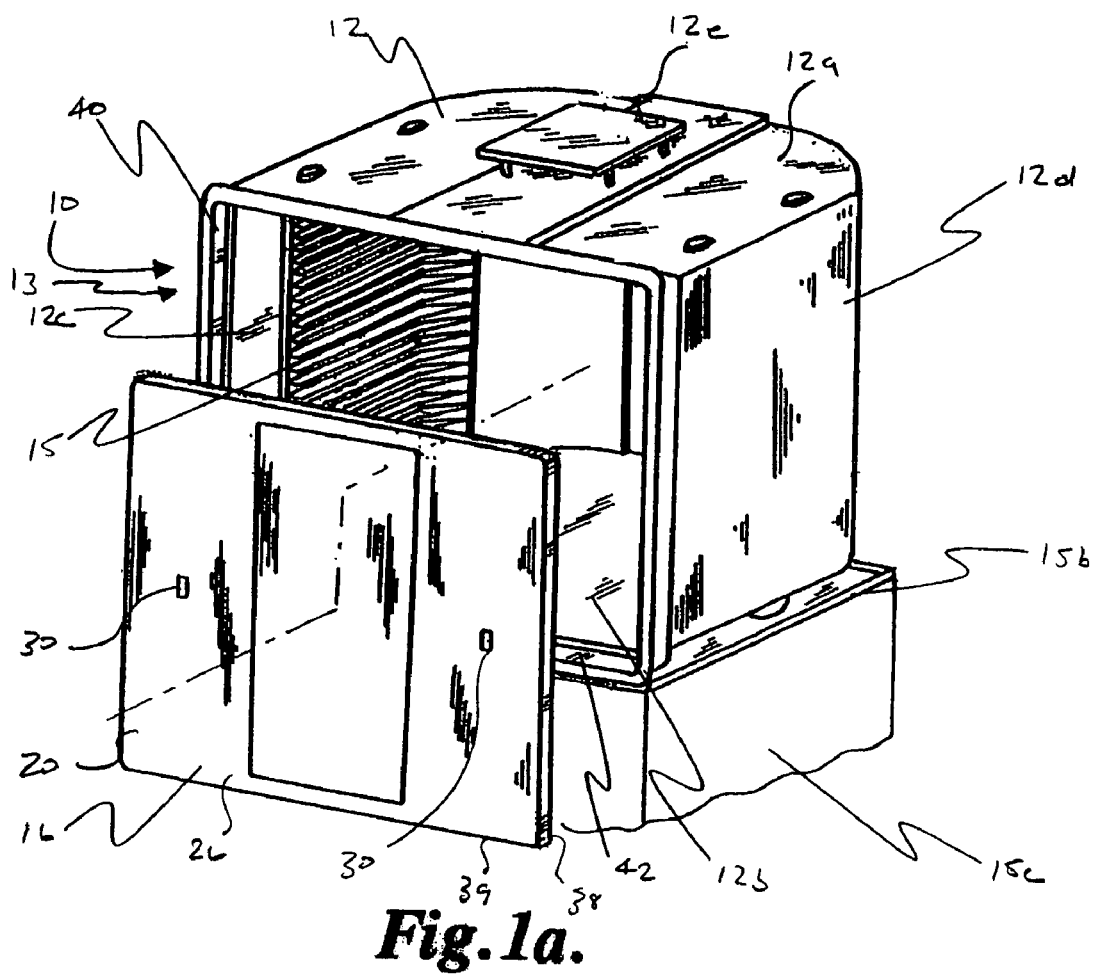
FIG. 1a is a perspective view of an alternative embodiment of a front-opening wafer containers seated on a piece of processing equipment.

Referring to FIG. 1, a front opening wafer container 10 according to an embodiment of the invention generally includes an enclosure portion 12, having a top 12a, a bottom 12b, a pair of opposing sides 12c, 12d, a back 12e and an open front 13, enclosing an open interior 14. One or more wafer supports 15 may be positioned inside enclosure portion 12, as depicted in FIG. 1a, for holding a plurality of wafers 15a in an axially aligned, generally parallel spaced apart arrangement. A kinematic coupling 15b may be provided on bottom 12b for interfacing with a piece of processing equipment 15c as is generally known in the art. Other configurations of front opening containers that may be suitable for use with the door latching mechanisms disclosed herein are generally disclosed in U.S. Pat. Nos. 6,644,477; 6,267,245; 6,216,874; 6,206,196; 6,010,008; and 5,944,194, all of which are commonly owned by the owners of the present invention and which are hereby fully incorporated herein by reference.

Referring again to FIGS. 1 and 1a, wafer container 10 further includes door 16 for sealingly closing open front 13. Door 16 generally includes chassis 18 having a front or exterior side 20, and a back or interior side 22. Front side 20 includes panel 26 covering latching mechanisms 28, which are operated through keyholes 30 defined in panel 26. Seal 38 is provided around the periphery 39 of the door 16 to sealingly engage with door frame 40 in enclosure portion 12. One or more wafer cushions (not depicted) for engaging and restraining wafers 15a may be provided on interior side 22 of door 16. Various configurations of such wafer cushions are described in the references previously incorporated herein by reference.

Figure 3:
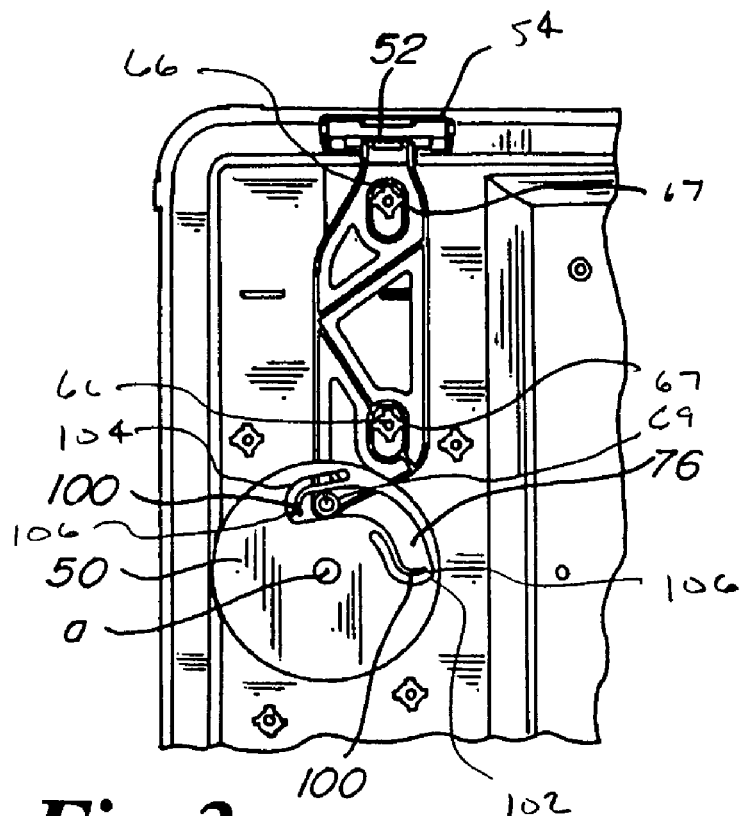
FIG. 3 is a front elevational view of a wafer container latch mechanism according to an embodiment of the invention.
Figure 4:
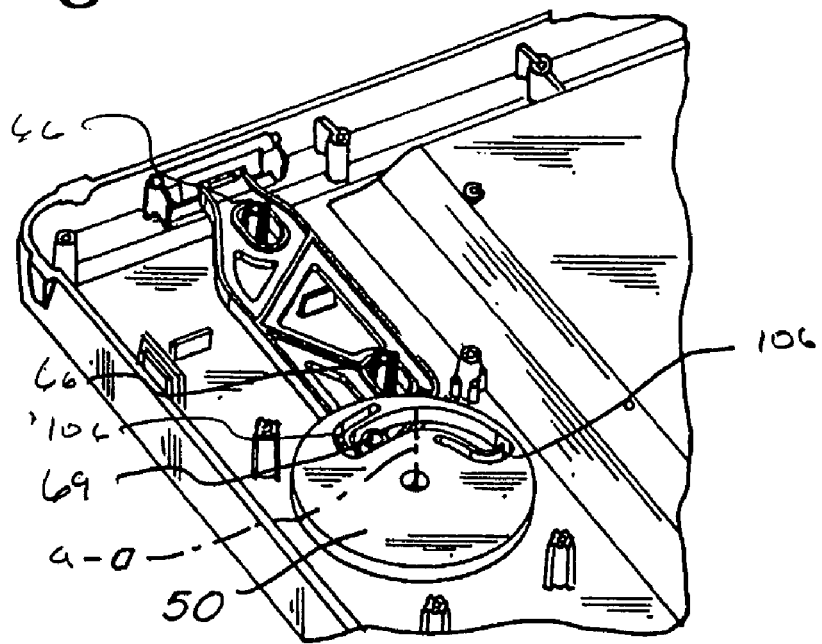
FIG. 4 is a perspective view of the corner of the wafer container door illustrated in FIG. 3.

Referring now to FIGS. 2, 3 and 4, door 16 is depicted without cover 26 so as to expose latching mechanisms 28. Latching mechanisms 28 of an embodiment of the invention generally include a rotatable cam 50, latching arms 52, latching members 54, and biasing spring 58. Latching mechanisms 28 are generally positioned in door enclosure 62, which is defined by surface 64 of chassis 18 and inner surface 65 of panel 26. Posts 66 are provided in door enclosure 62 extending between surface 64 and inner surface 65 of panel 26. Latch arms 52 have elongate slots 67 in which posts 66 are slidingly received so that latch arms 52 are laterally slidable in the X axis direction but are constrained from movement in the Y axis direction. Latch arms 52 are located in the Z axis direction principally by surface 64 of chassis 18 and inner surface 65 of panel 26.

In embodiments of the invention as depicted in FIGS. 6 and 7, resilient members 67 may be provided on latch arms 52, extending therefrom to engage surface 64 of chassis 18. Resilient members 67 may serve the dual function of dampening vibrations generated during operation of latching mechanism 26, and may also serve to more precisely locate latch arms 52 in the Z axis direction. It will be appreciated that resilient members 67 may be integrally formed as one piece with latch arm 52 or may be separate components attached to latch arm 52.

Cam 50 is rotatably mounted about axis a-a on post 68, which extends outwardly from surface 64 into latch enclosure 62. Latch arms 52 generally include a cam follower portion 69 at proximal end 70, which slidingly engages in elongate slot 76 in cam 50. Slot 76 is generally configured so that, as cam 50 is rotated and cam follower portion 69 slides in slot 76, latch arms 52 slide laterally inward or outward relative to cam 50 depending on the direction of rotation of cam 50. It will be appreciated that in alternative embodiments, a groove or other structure that does not extend all the way though cam 50 may be provided in place of slot 76 with the same or similar effect. Latching members 54 are provided at distal end 72 of latch arms 52. In operation, these latching members 54 are extended and retracted by latch arms 52 so as to engage latch receiver recesses 42 in door frame 40 in order to secure door 16 in place on enclosure portion 12. In some embodiments, latching member 54 may include a pivoting assembly. Latch mechanisms with such pivoting members are disclosed in U.S. Pat. Nos. 5,628,683 and 6,000,732, each of which assigned to the owner of the instant invention and hereby fully incorporated herein by reference. Such pivoting latches enable the latching member 54 to extend first out of the door enclosure in the "Y" direction, and then move in the "Z" direction, away from the container portion to pull the door into the door frame and secure the seal with the door frame. This motion is generally described in U.S. Pat. No. 4,995,430, Sealable Transportable Container Having Improved Latch Mechanism, which has a common assignee as the instant application, and which is also fully incorporated herein by reference.

Figure 8:
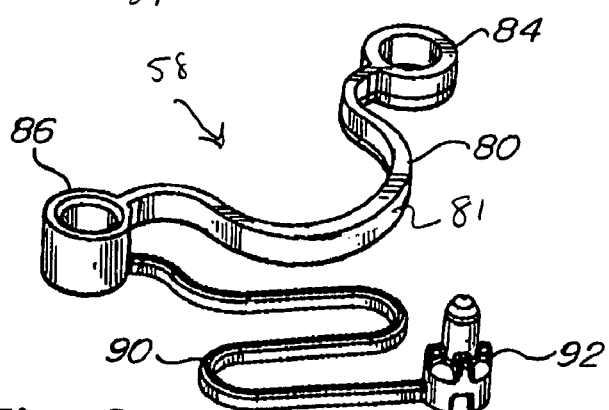
FIG. 8 is a perspective view of a biasing spring in accordance with an embodiment of the invention.

Referring now to FIGS. 2 and 8, a spring 58 in the form of biasing spring 80 is depicted according to an embodiment of the invention. Biasing spring 80 generally includes a main portion 81 and secondary portion 90. Bushings 84, 86, are located at each end of main portion 81. Bushing 84 is rotatably coupled on post 87, which extends from cam 50, while bushing 86 is rotatably coupled with post 88, which extends from surface 64 of chassis 18. In operation, main portion 81 functions to bias cam 50, and accordingly, latching mechanisms 28, toward first and second favored positions corresponding to latched and unlatched conditions, as described in more detail hereinbelow and in copending U.S. patent application Ser. No. 10/318,374 entitled WAFER CARRIER DOOR AND SPRING BIASED LATCHING MECHANISM, commonly owned by the owners of the present invention and hereby fully incorporated herein by reference.

According to an embodiment of the present invention, secondary portion 90 of biasing spring 80 is attached to, or is integrally formed in one piece with main portion 81 at bushing 86. Secondary portion 90 is resilient and may have a lower spring constant relative to main portion 81, due to a 30% to 90% smaller cross-section. Secondary portion 90 has a post 92 at distal end 94, which is received in an aperture 96 provided in a post 98 extending from surface 64 of chassis 18. In operation, secondary portion provides a dampening effect for vibrations in main portion 81 of spring 80, that may result during shifting of latching mechanism 26 between the first and second favored positions.

In embodiments of the invention where it is desirable to provide an electrical path to ground from wafers in the container, cam 50 and biasing spring 80 may be made from electrically conductive material, such as carbon filled thermoplastic. Secondary portion 90 may be electrically conductively connected with a conductive wafer cushion on door 16 as described above. When door 16 is engaged with enclosure portion 12 with wafers 15a supported in wafer supports 15, the conductive wafer cushion engages the wafers and a conductive path is provided from the wafers to cam 50. Cam 50 is then engaged with an electrically grounded key by the robotic handing equipment.

In the embodiment of FIGS. 3 and 4, slot 76 is provided with a pair of dampening springs 100 extending inwardly proximate each end 102, 104. Springs 100 are preferably integrally molded in one piece with cam 50, but may also be separate structures. In operation, as cam 50 is rotated and cam follower 69 approaches either end 102, 104, spring 100 first engages and begins to slide on cam follower 69. As cam follower 69 moves closer to the end 102, 104, spring 100 is compressed outward, and exerts an increasing amount of bias on cam follower 69, thereby increasing friction. This increasing friction tends to decelerate cam follower 69 in a controlled fashion as it moves further toward ends 102, 104, and operating to minimize transfer of te shock forces and vibration at the end of travel. Moreover, curved end 106 may be provided on each spring 100, conformingly shaped with cam follower 69 so as to provide a detent for holding the mechanism at a favored position when cam followed 69 is positioned at either end 102, 104. It will, of course be appreciated that in other embodiments springs 100 may be provided only at end 102 or only at end 104 of slot 76, if it is desired to provide deceleration and dampening at only one limit of mechanism travel.

Figure 5C:
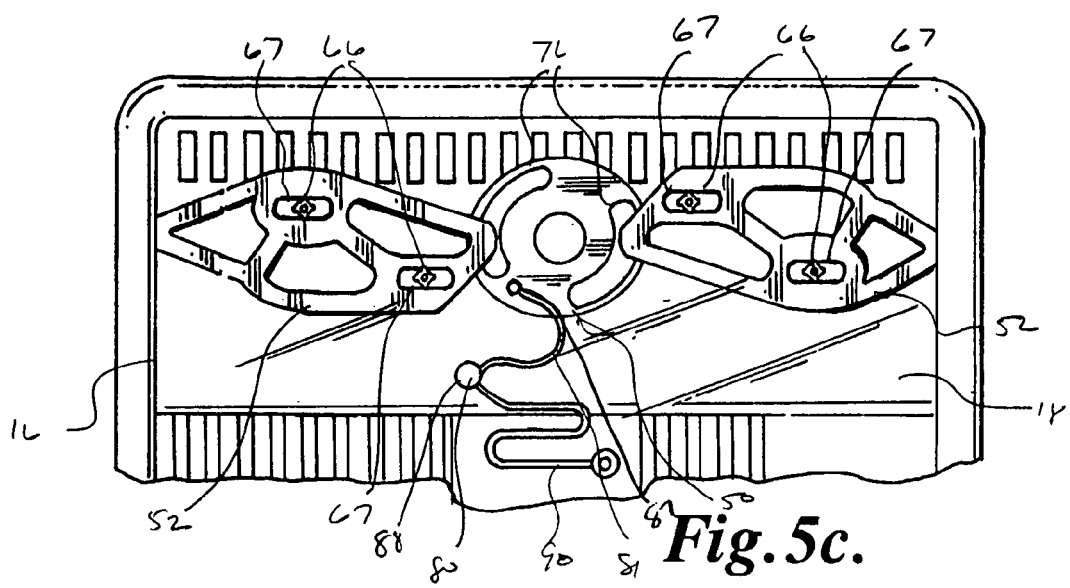
FIG. 5c depicts the latch mechanism of FIG. 5a in a fully latched position.
Figure 5B:
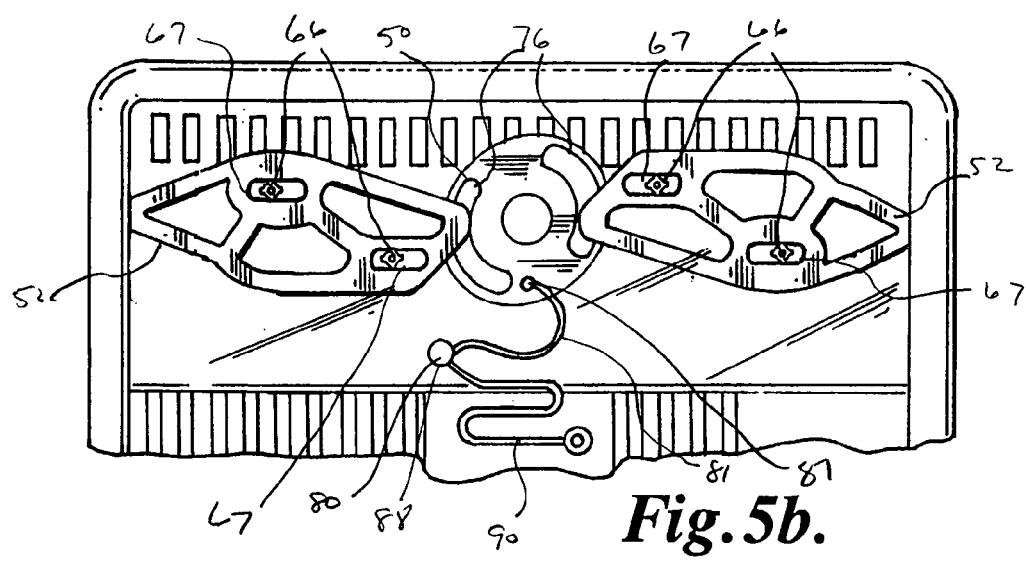
FIG. 5b depicts the latch mechanism of FIG. 5a in an intermediate position.
Figure 5A:
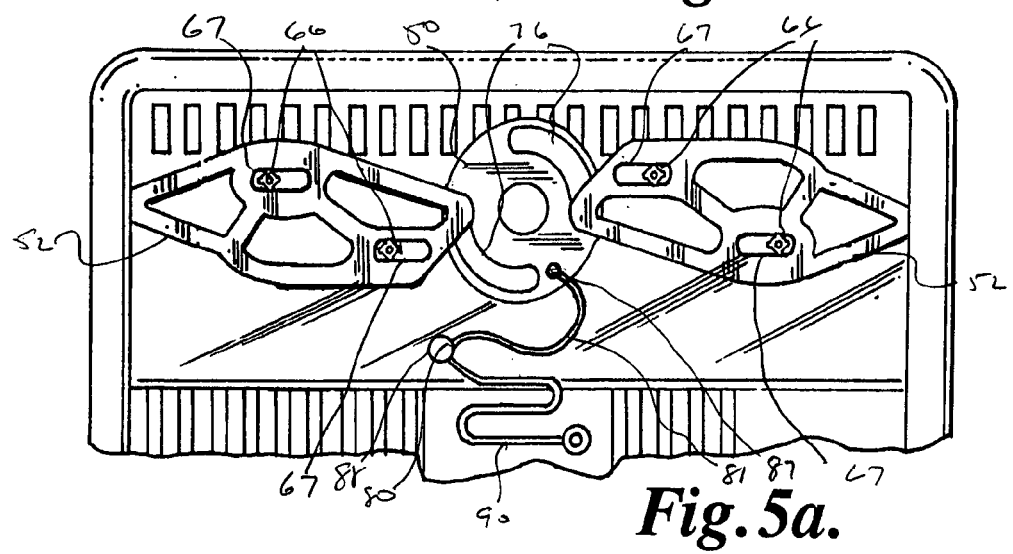
FIG. 5a is a plan view of a latch mechanism according to the invention with the latch in an unlatched position.

Overall operation of latching mechanism 26 is depicted generally in the sequence of FIGS. 5a, 5b and 5c. In the latched, or first favored position as depicted in FIG. 5c, spring 80 is past center and is biasing cam 50 in the clockwise direction. In intermediate position 5b, spring 80 is generally on center and is not biasing cam 50 in either the clockwise or counterclockwise directions. In FIG. 5a, corresponding to the unlatched or second favored position, spring 80 is past center in the opposite direction and is biasing cam 50 in the counterclockwise direction. As cam 50, and by extension, latching mechanism 26 is shifted between the first and second favored positions of FIGS. 5a and 5c, main portion 81 of biasing spring 80 provides velocity control to the moving parts of latch mechanism 26, which secondary portion 90 of biasing spring 80 dampens vibrations generated as the mechanism reaches the limits of travel.

Various components identified herein may be molded from suitable thermoplastic or other material having characteristics suitable for use in wafer containers. Desirable thermoplastics would include polyetheretherketone (PEEK) with carbon fiber filler or carbon powder filler, polyetherimide (PEI), polycarbonate or other suitable thermoplastics as are generally known in the art.

What is claimed is:

1. A container for holding a plurality of wafers in an axially aligned, generally parallel spaced apart arrangement, the container comprising:
    an enclosure portion having a top, a bottom, a pair of opposing sides, a back and an open front;
    at least one wafer support in the enclosure;
    a kinematic coupling on the bottom of the enclosure; and
    a door for sealingly closing the open front comprising:
        a chassis; and
    an operable latching mechanism on the chassis including a cam selectively rotatable to shift the latching mechanism between a first favored position and a second favored position, the latching mechanism including a biasing spring having a first resilient portion operably coupled with the cam and the chassis and disposed to provide a biasing force for urging the latching mechanism toward each of the first and second favored positions, the latching mechanism further including at least one vibration dampener for dampening vibrations generated when the latching mechanism is shifted between the first and second favored positions, wherein the cam has an elongate slot defined therein with first and second opposing ends and the latching mechanism further comprises at least one laterally slidable latching arm having a cam follower portion slidably engaged in the slot, and wherein the at least one vibration dampener includes a spring disposed proximate the first end of the slot so as to engage the cam follower portion and exert a biasing force resisting motion of the cam follower portion towards the first end of the slot.

2. The container of claim 1, wherein the vibration dampener further comprises a second spring disposed proximate the second end of the slot so as to engage the cam follower portion and exert a biasing force resisting motion of the cam follower portion towards the second end of the slot.

3. A container for holding a plurality of wafers in an axially aligned, generally parallel spaced apart arrangement, the container comprising:
    an enclosure portion having a top, a bottom, a pair of opposing sides, a back and an open front;
    at least one wafer support in the enclosure;
    a kinematic coupling on the bottom of the enclosure; and
    a door for sealingly closing the open front comprising:
        a chassis; and
    an operable latching mechanism on the chassis including a cam selectively rotatable to shift the latching mechanism between a first favored position and a second favored position, the latching mechanism including a biasing spring having a first resilient portion operably coupled with the cam and the chassis and disposed to provide a biasing force for urging the latching mechanism toward each of the first and second favored positions, the latching mechanism further including at least one vibration dampener for dampening vibrations generated when the latching mechanism is shifted between the first and second favored positions, wherein the at least one vibration dampener includes a second resilient portion of the biasing spring operably coupled with the chassis at a location separated from the location where the first resilient portion is coupled to the chassis.

4. The container of claim 3, wherein the door includes a wafer cushion portion, wherein the cam and the biasing spring are electrically conductive, and wherein the second resilient portion of the biasing spring is electrically conductively coupled with the wafer cushion portion.

5. A container for holding a plurality of wafers in an axially aligned, generally parallel spaced apart arrangement, the container comprising:
- an enclosure portion having a top, a bottom, a pair of opposing sides, a back and an open front;
- at least one wafer support in the enclosure;
- a kinematic coupling on the bottom of the enclosure; and
- a door for sealingly closing the open front comprising:
  - a chassis; and
  - an operable latching mechanism on the chassis including a cam selectively rotatable to shift the latching mechanism between a first favored position and a second favored position, the latching mechanism including a biasing spring having a first resilient portion operably coupled with the cam and the chassis and disposed to provide a biasing force for urging the latching mechanism toward each of the first and second favored positions, the latching mechanism further comprising means to dampening vibrations as the latching mechanism is shifted toward at least one of generated when the latching mechanism is shifted between the first and second favored positions.

6. The container of claim 5, wherein the cam has an elongate slot defined therein with first and second opposing ends and the latching mechanism further comprises at least one laterally slidable latching arm having a cam follower portion slidably engaged in the slot and wherein the means for dampening vibrations includes a spring disposed proximate the first end of the slot so as to engage the cam follower portion and exert a biasing force resisting motion of the cam follower portion towards the first end of the slot.

7. The container of claim 6, wherein the means for dampening vibrations further comprises a second spring disposed proximate the second end of the slot so as to engage the cam follower portion and exert a biasing force resisting motion of the cam follower portion towards the second end of the slot.

8. The container of claim 7, wherein the latching mechanism further comprises a biasing spring having a first resilient portion operably coupled with the cam and the chassis and disposed to provide a biasing force for urging the latching mechanism toward each of the first and second favored positions, and wherein the at least one vibration dampener includes a second resilient portion of the biasing spring operably coupled wit the chassis.

9. The container of claim 8, wherein the door includes a wafer cushion portion, wherein the cam and the biasing spring are electrically conductive, and wherein the second resilient portion of the biasing spring is electrically conductively coupled with the wafer cushion portion.

* * * * *

UNITED STATES PATENT AND TRADEMARK OFFICE
CERTIFICATE OF CORRECTION

PATENT NO. : 7,182,203 B2 Page 1 of 1
APPLICATION NO. : 10/982402
DATED : February 27, 2007
INVENTOR(S) : John Burns et al.

It is certified that error appears in the above-identified patent and that said Letters Patent is hereby corrected as shown below:

Column 4, line 26, please replace "though" with --through--
Column 4, line 35, please add --is-- after "which"
Column 5, line 20, please replace "handing" with --handling--
Column 5, line 33, please replace "re" with --the--
Column 5, line 37, please replace "followed" with --follower--
Column 5, line 38, please replace "course" with --course,--
Column 5, line 53, please remove the "," after extension
Column 5, line 53, please add a comma after 26
Column 7, line 21, please remove extra space after "generated"
Column 8, line 1, please insert a comma after slot Signed and Sealed this Twenty-ninth Day of July, 2008

JON W. DUDAS
*Director of the United States Patent and Trademark Office*